United States Patent
Komatsu

(10) Patent No.: US 10,361,320 B2
(45) Date of Patent: Jul. 23, 2019

(54) PROCESS OF FORMING METAL-INSULATOR-METAL (MIM) CAPACITOR

(71) Applicant: SUMITOMO ELECTRIC DEVICE INNOVATIONS, INC., Yokohama, Kanagawa (JP)

(72) Inventor: Yoshihide Komatsu, Yokohama (JP)

(73) Assignee: SUMITOMO ELECTRIC DEVICE INNOVATIONS, INC., Kanagawa (JP)

( * ) Notice: Subject to any disclaimer, the term of this patent is extended or adjusted under 35 U.S.C. 154(b) by 0 days.

(21) Appl. No.: 15/624,517

(22) Filed: Jun. 15, 2017

(65) Prior Publication Data
US 2017/0365722 A1    Dec. 21, 2017

(30) Foreign Application Priority Data
Jun. 16, 2016   (JP) .................... 2016-119884

(51) Int. Cl.
| H01L 27/11507 | (2017.01) |
| H01L 29/94 | (2006.01) |
| H01L 21/04 | (2006.01) |
| H01L 23/522 | (2006.01) |
| H01L 29/49 | (2006.01) |
| H01L 29/51 | (2006.01) |
| H01L 29/739 | (2006.01) |
| H01L 49/02 | (2006.01) |

(52) U.S. Cl.
CPC .......... *H01L 29/94* (2013.01); *H01L 21/0425* (2013.01); *H01L 23/5222* (2013.01); *H01L 28/75* (2013.01); *H01L 29/4908* (2013.01); *H01L 29/4975* (2013.01); *H01L 29/517* (2013.01); *H01L 29/7394* (2013.01)

(58) Field of Classification Search
CPC .......................... H01L 28/60; H01L 27/11507
See application file for complete search history.

(56) References Cited

U.S. PATENT DOCUMENTS

| 2006/0086952 A1* | 4/2006 | Kim ................. H01L 27/10852 257/211 |
| 2014/0054677 A1* | 2/2014 | Hu ..................... H01L 21/2656 257/329 |

FOREIGN PATENT DOCUMENTS

JP        08-293581        11/1996

* cited by examiner

*Primary Examiner* — Mohammad M Choudhry
(74) *Attorney, Agent, or Firm* — Smith, Gambrell & Russell, LLP.

(57) ABSTRACT

A metal-insulator-metal (MIM) capacitor and a process of forming the same are disclosed. The process includes steps of: forming a lower electrode that provides a lower layer and an upper layer; forming an opening in the upper layer; forming a supplemental layer on the lower layer exposed in the opening; heat treating the lower electrode and the supplemental layer; covering at least the upper layer of the lower electrode with an insulating film; and forming an upper electrode in an area on the insulating film, where the area is not overlapped with the supplemental layer and is within 100 μm at most from the supplemental layer. A feature of the MIM capacitor is that the supplemental layer is made of a same metal as a metal contained in the lower layer of the lower electrode.

7 Claims, 9 Drawing Sheets

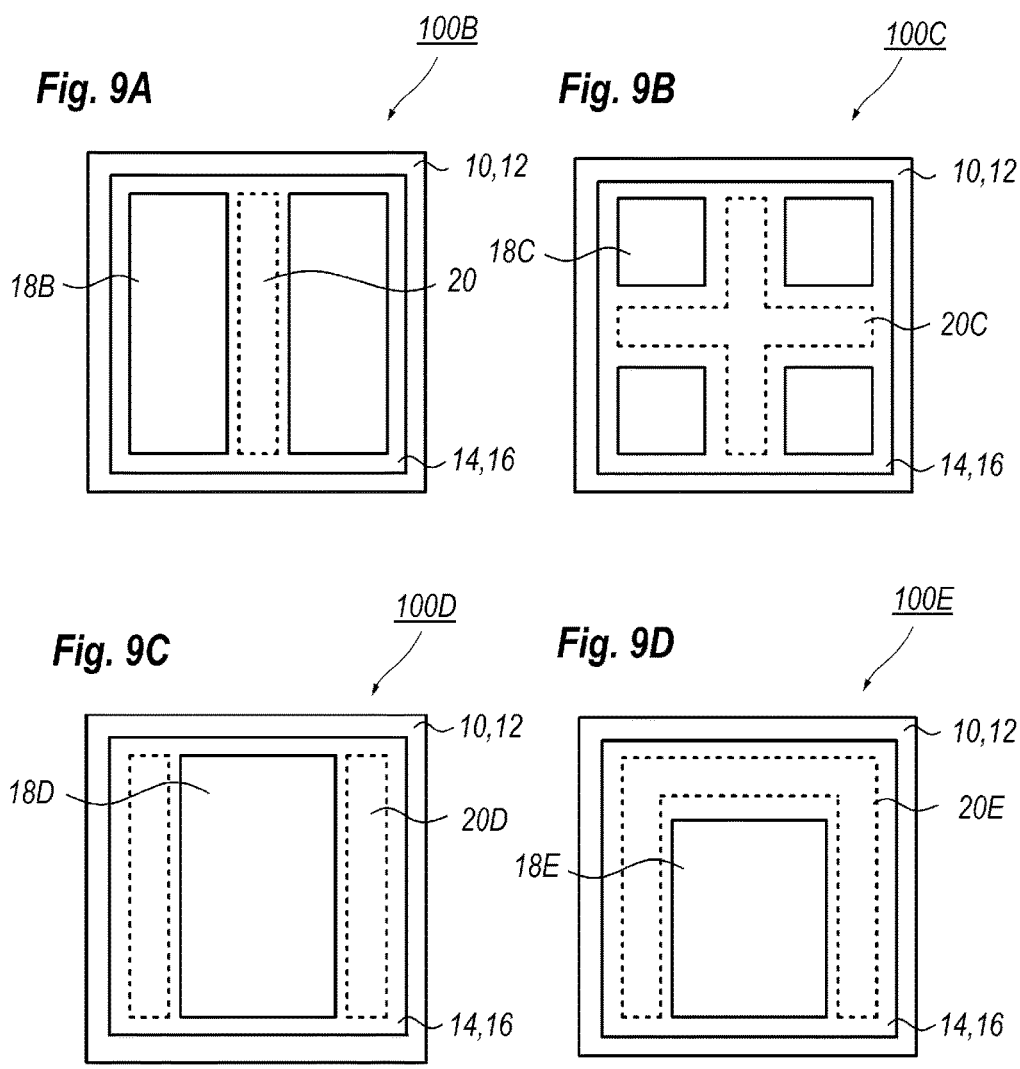

PROCESS OF FORMING METAL-INSULATOR-METAL (MIM) CAPACITOR

CROSS REFERENCE TO RELATED APPLICATIONS

The present application is based upon and claims the benefit of priority under 35 USC 119 of Japanese Patent Application No. 2016-119884 filed on Jun. 16, 2016, the entire disclosure of which is incorporated herein by reference in its entirety.

FIELD OF THE INVENTION

The present invention relates to a metal-insulator-metal (MIM) capacitor and a process of forming the same.

BACKGROUND ARTS

A MIM capacitor is well known and has been implemented within an integrated circuit. A MIM capacitor is generally formed by deposing an insulating film on a lower electrode and an upper electrode on the insulating film. During the formation of a MIM capacitor, a heat treatment is often carried out to reduce resistivity of the electrodes and release stresses induced in the insulating film. However, such a heat treatment sometimes causes voids, vacancies, and/or hillocks in the electrodes. In particular, when such defects are induced in the lower electrode, and the insulating is formed of the lower electrode, the insulating film often becomes thinner around the defects. Thinner insulating film locally strengthens an electric field and degrades a breakdown voltage of a MIM capacitor.

SUMMARY OF THE INVENTION

An aspect of the present invention relates to a process of forming a metal-insulator-metal (MIM) capacitor. The process includes steps of: (1) forming a lower electrode that provides a lower layer and an upper layer that is made of refractory metal; (2) forming an opening in the upper layer of the lower electrode; (3) forming a supplemental layer on the lower layer exposed within the opening of the upper layer; (4) heat treating the lower electrode and the supplemental layer at a temperature higher than 300° C.; (5) covering at least the upper layer of the lower electrode with an insulating film; and (6) forming an upper electrode in an area on the insulating film, where the area is not overlapped with the supplemental layer and within 100 μm at most from the supplemental layer. A feature of the process of the invention is that the supplemental layer is made of metal same with a metal contained in the lower layer of the lower electrode.

Another aspect of the present invention relates to a metal-insulator-metal (MIM) capacitor. The MIM capacitor of the invention includes a lower electrode, a supplemental layer, an insulating film and an upper electrode, where the lower electrode, the supplemental layer, and the upper electrode form a primary portion of the MIM capacitor. The lower electrode of the invention includes a lower layer and an upper layer provided on the lower layer. The upper layer includes an opening through which the lower layer exposes. The supplemental layer is provided on the lower layer exposed within the opening of the upper layer. The insulating film covers at least the upper layer of the lower electrode. The upper electrode is provided in an area on the insulating film, where the area is not overlapped with the supplemental layer but within 100 μm at most from the supplemental layer. A feature of the MIM capacitor of the invention is that the supplemental layer is made of metal contained in the lower layer of the lower electrode.

BRIEF DESCRIPTION OF THE DRAWINGS

The foregoing and other purposes, aspects and advantages will better understood from the following detailed description of a preferred embodiment of the invention with reference to the drawings, in which:

FIGS. 9A to 9D are plan views of capacitors according to the fourth to seventh embodiment of the present invention.

DESCRIPTION OF EMBODIMENT

Next, embodiment of the present invention will be described as referring to drawings. In the description of the drawings, numerals or symbols same with or similar to each other will refer to elements same with or similar to each other without duplicating explanations.

Figure 1A:
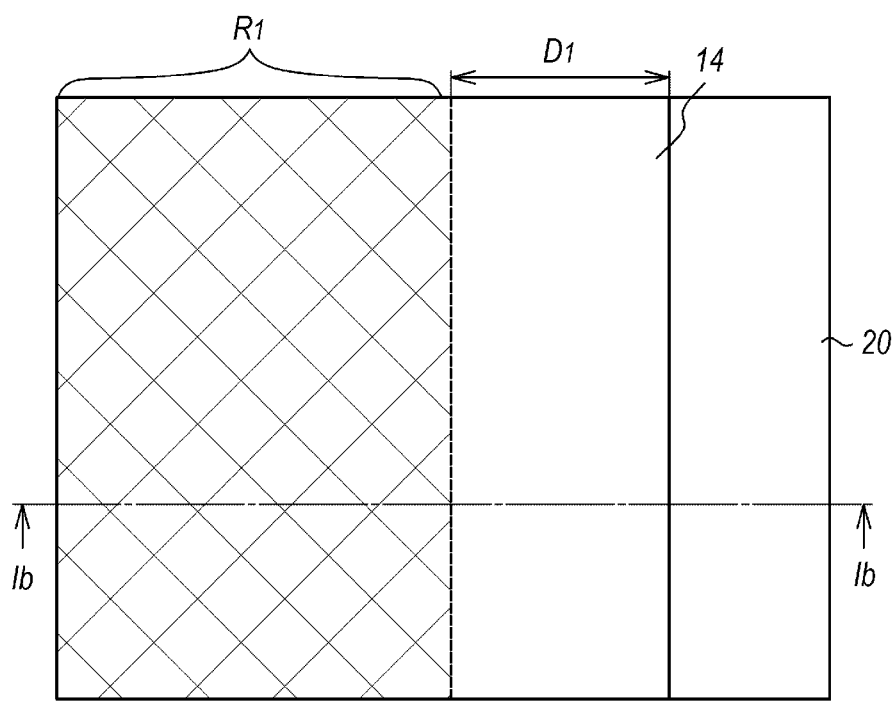
FIG. 1A is a plan view showing a lower electrode and a metal layer.
Figure 1B:
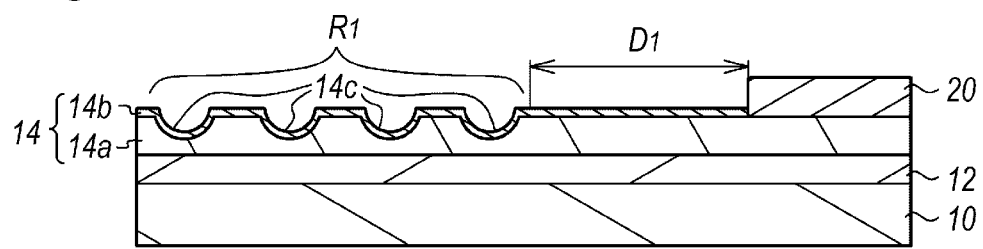
FIG. 1B shows a cross section taken along the line Ib-Ib indicated in FIG. 1A.

FIG. 1A is a plan view showing a lower electrode and a supplemental layer of a metal-insulator-metal (MIM) capacitor 100 of the embodiment, and FIG. 1B shows a cross section thereof taken along the line Ib-Ib indicated in FIG. 1A, where FIGS. 1A and 1B show the lower electrode 14 and the supplemental layer 20 after heat treatment.

The substrate 10, as shown in FIG. 1B, provides an insulating film 12 on a primary surface thereof. The substrate 10 may be made of insulating material, typically silicon carbide (SiC) when a semiconductor device to be formed on the substrate is primarily made of nitride semiconductor materials. The insulating film 12 may be made of inorganic material such as silicon nitride (SiN), silicon oxide ($SiO_2$), and so on.

The insulating film 12 provides a lower electrode 14 thereon. The lower electrode 14 includes a lower layer 14a and an upper layer 14b made of refractory metal such as titanium (Ti). The lower layer 14a may be a stack of, from the side of the insulating film 12, tungsten silicide (WSi) with a thickness of 150 nm, titanium (Ti) with a thickness of 5 nm, and gold (Au) with a thickness of 200 nm. The upper layer 14b, which has a thickness of 5 nm, partly covers the lower layer 14a. A supplemental layer 20 is formed on the lower layer 14a in a portion not covered with the upper layer 14b. The supplemental layer 20, which may be formed by gold (Au) plating, has a width of 50 to 150 μm and a thickness of 0.2 to 1.0 μm. The lower electrode 14 provides a region at least a distance $D_1$, for instance 100 μm, apart from the supplemental layer 20. After the formation of the upper and lower layers, 14a and 14b, and the supplemental layer 20, these layers and the insulating film 12 are performed with heat treatment at a temperature of 300° C. for a half hour.

The heat treatment generates many voids 14c in the region $R_1$ but other regions within a distance $D_1$ from the supplemental layer 20 become substantially free from the voids 14c as shown in FIG. 1B, and the supplemental layer 20 itself causes no voids.

One of reasons to cause the voids 14c or become free from the voids 14c is stress induced during the heat treatment. That is, the lower electrode 14, exactly, the lower and upper layers, 14a and 14b, and the supplemental layer 20; the insulating film 12; and the substrate 10 have thermal expansion coefficient specific thereto but different from each other. The stress thus induced in the lower layer 14a; in particular, the Au layer in the lower layer 14a may physically diffuse Au atoms, which leaves Au vacancies which resultantly generates the voids 14c. The Au layer is the thickest among metals in the lower layer 14 and the WSi is thermally stable compared with gold (Au); accordingly, the diffusion of Au atoms may be a primary reason for generating voids 14c. When the upper layer 14b made of titanium (Ti) covers the Au layer in the lower layer 14a to prevent hillocks form being formed in the surface of Au layer, the vertical diffusion of Au atoms along the thickness direction may be effectively prevented. The upper layer 14b may be made of, except for Ti, tantalum (Ta), tungsten (W), alloy of those, and so on. However, the upper layer 14b may increase stresses affected to the lower layer 14a, which enhances the diffusion of Au atoms, and resultantly increases the voids 14c.

The supplemental layer 20, which is foiled by gold (Au) plating, contains a lot of Au atoms. Because of no layer thereon, not only stresses affected to the supplemental layer 20 may be reduced but those caused in the lower layer 14a in the region closer to the supplemental layer 20, within the distance $D_1$ from the supplemental layer 20, may be weakened. Even when substantial Au atoms diffuse in the region close to the supplemental layer 20, the supplemental layer 20, exactly, Au atoms contained in the supplemental layer 20, may compensate the vacancies of Au atoms in the lower layer 14a. Thus, the supplemental layer 20 may effectively suppress the formation of the voids 14c in the region closer thereto. Moreover, the supplemental layer 20 is in direct contact with the lower layer 14a that contains Au atoms in a topmost layer thereof, which may enhance the diffusion of Au atoms from the supplemental layer 20 to the topmost layer, thus suppresses the formation of the Au vacancies.

First Embodiment

Next, embodiment according to the present invention will be described.

Figure 2A:
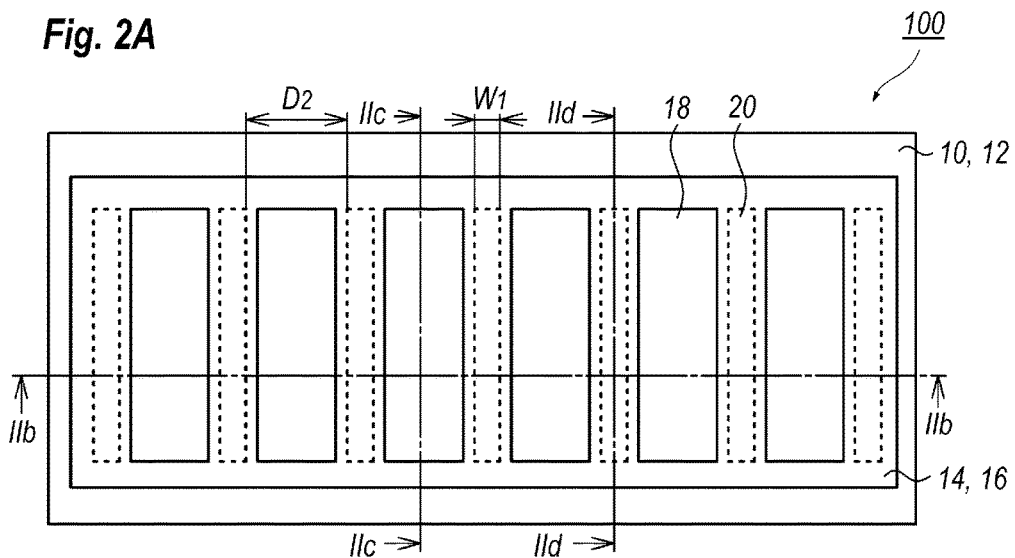
FIG. 2A is a plan view of a capacitor according to the first embodiment of the present invention.
Figure 2B:
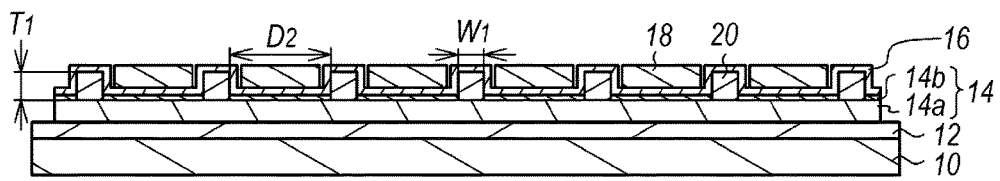
FIGS. 2B to 2D show cross sections taken along the lines, IIb-IIb, IIc-IIc, and IId-IId, respectively, indicated in FIG. 2A.
Figure 2C:
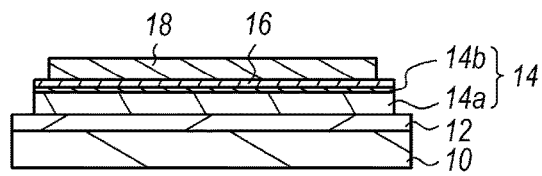
Figure 2D:
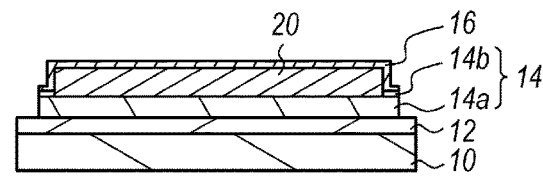

FIG. 2A is a plan view showing a MIM capacitor 100 according to the first embodiment of the present invention, and FIGS. 2B to 2D shows cross sections of the capacitor 100 that are taken along the lines, IIb-IIb, IIc-IIc, and IId-IId, respectively, indicated in FIG. 2A.

The capacitor 100 has a type of metal-insulator-metal (MIM) capacitor including a substrate 10, an insulating film 12, a lower electrode 14, an insulating film 16, an upper electrode 18, and a supplemental layer 20. The lower electrode 14 includes a lower layer 14a and a titanium (Ti) layer 14b as an upper layer. The upper layer 14b may be, except for Ti, made of tantalum (Ta), tungsten (W), and so on.

The substrate 10 may include a base made of silicon carbide (SiC) and a semiconductor layers made of nitride semiconductor materials grown on the SiC base. Provided on the substrate 10 is the insulating film 12 made of silicon nitride (SiN). The lower electrode 14, exactly, the lower layer 14a thereof is formed on the insulating film 12. The lower layer 14a may have a stack including tungsten silicide (WSi) with a thickness of 150 nm, titanium (Ti) with a thickness of 5 nm, and gold (Au) with a thickness of 200 nm. The upper layer 14b, which may be made of titanium (Ti) partially covers the lower layer 14a except for areas where supplemental layers 20 are to be formed. That is, the upper layers 14b and the supplemental layer 20 are alternately arranged on the lower layer 14a. The supplemental layer 20 may be made of gold (Au) with a thickness of 0.2 to 1.0 μm and widths $W_1$ of 50 to 150 μm. A thinner supplemental layer is not preferable from a viewpoint of forming voids; while, a thicker supplemental layer is also not preferable from a viewpoint of covering by an insulating film 16. As described above, the supplemental layer 20 are arranged at intervals with distances $D_2$ of 50 to 200 μm.

The supplemental layer 20 are unnecessary to be accompanied with Ti layer on tops and sides thereof; that is, the supplemental layer 20 are not covered with Ti layer in the top and the sides thereof, because the supplemental layer 20 that are formed only by gold (Au) cause lesser stresses during the thermal treatment after the formation of the upper layer 14b compared with the Au layer within the lower layer 14a. The supplemental layer 20 accompany with the lower layer 14a that includes gold (Au) in topmost thereof, where the gold (Au) layer in the lower layer 14a and the supplemental layer 20, which also includes gold (Au), have a total thickness of about 0.4 to 1.2 μm. Accordingly, a Ti layer to be provided on the top and sides of the supplemental layer 20 possible causes cracks after the heat treatment because of a thicker Au layer in the supplemental layer 20. When the insulating film 16 covers those Ti layer accompanied with the cracks, the insulating film 16 possibly forms many pin-holes which make a short passes between the upper electrode 18 and the lower electrode 14. Accordingly, the supplemental layer 20 of the embodiment is not covered with the Ti layer.

The insulating film 16 fully covers the upper layer 14b made of Ti and the supplemental layers 20, while, the upper electrode 18 is provided in areas overlapping with areas in the lower electrode 14 where no supplemental layers 20 exist. That is, because the supplemental layers 20 periodically protrude from the upper layer 14b, the respective upper electrodes 18 are arranged in side-by-side with respect to the supplemental layer 20. The insulating film 16 may be made of silicon nitride (SiN) with a thickness of around 200 nm, while, the upper electrode 18 may be a metal stack including, from the side of the insulating film 16, a titanium (Ti) layer with a thickness of 3 to 10 nm and a gold (Au) layer with a thickness of 200 to 500 nm.

Figure 3A:
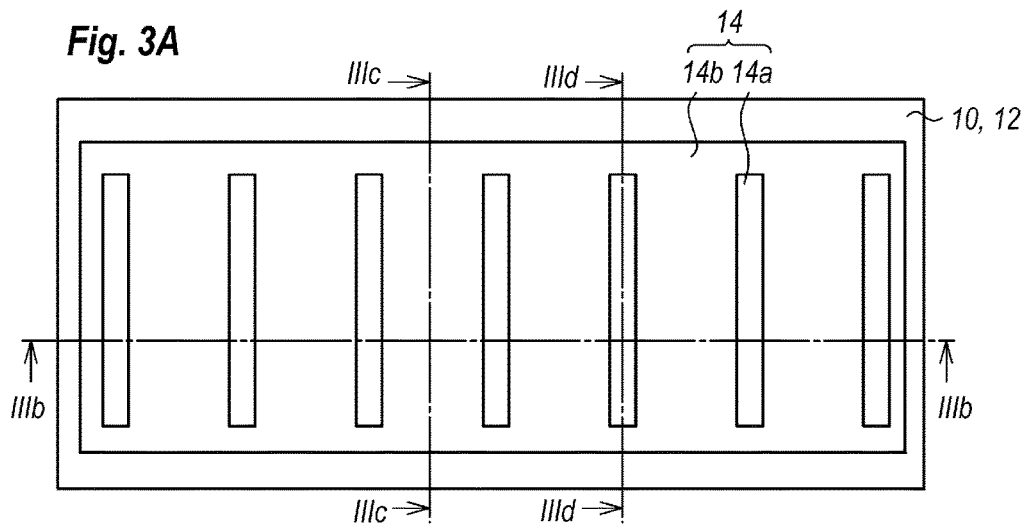
FIG. 3A is a plan view showing a process of forming the capacitor of the first embodiment.
Figure 3B:
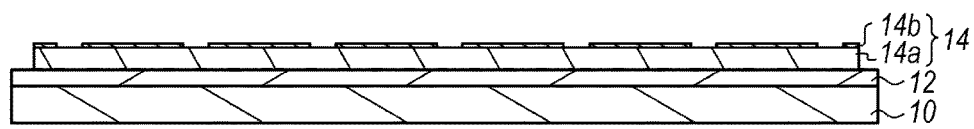
FIGS. 3B to 3D show cross sections taken along the lines, IIIc-IIIc, and IIId-IIId, respectively, indicated in FIG. 3A.
Figure 3C:
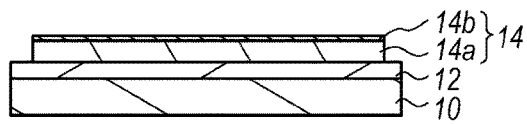
Figure 3D:
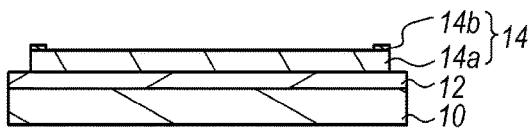
Figure 4A:
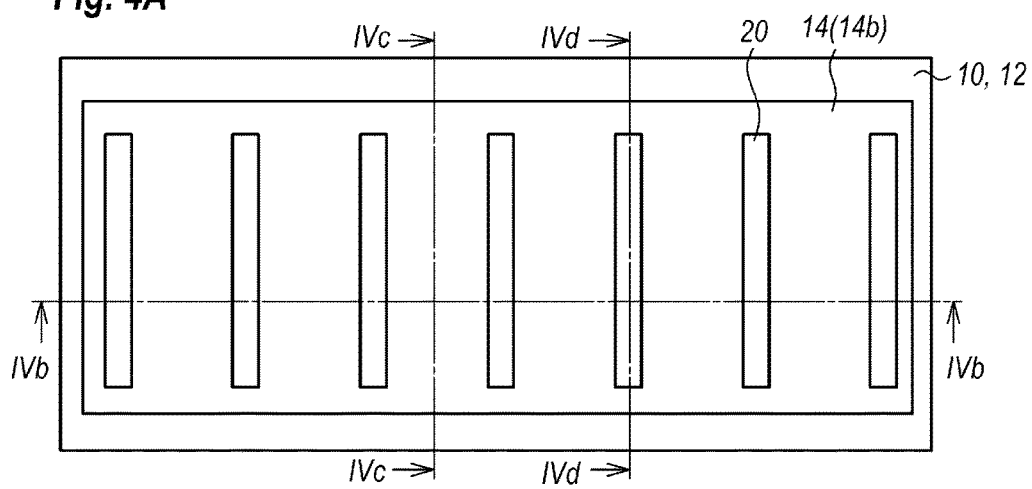
FIG. 4A is a plan view showing the process of forming the capacitor.
Figure 4B:
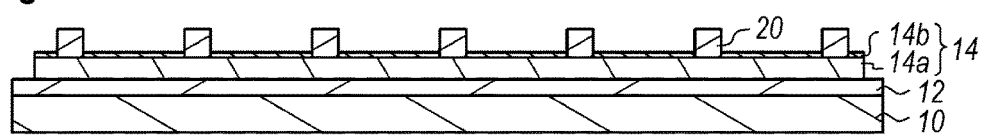
FIGS. 4B to 4D show cross sections of the capacitor taken along the line IVb-IVb, IVc-IVc, and IVd-IVd, respectively, where they are indicated in FIG. 4A.
Figure 4C:
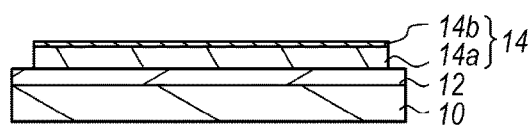
Figure 4D:
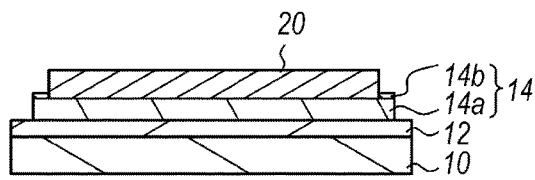
Figure 5A:
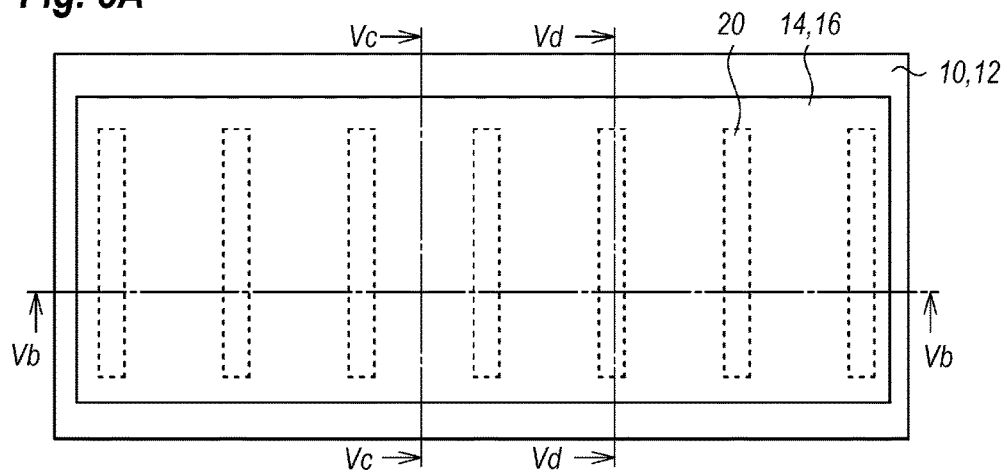
FIG. 5A is a plan view showing the process of forming the capacitor.
Figure 5B:
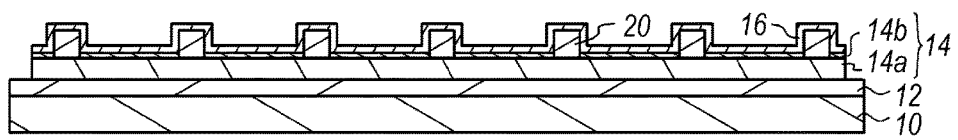
FIGS. 5B to 5D show cross sections of the capacitor taken along the line Vb-Vb, Vc-Vc, and Vd-Vd, respectively, where they are indicated in FIG. 5A.
Figure 5C:
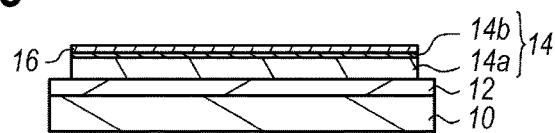
Figure 5D:
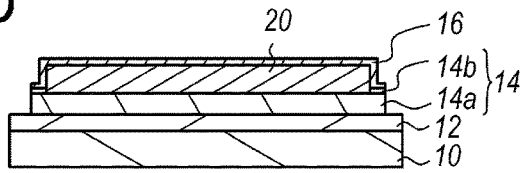

The substrate 10 may include semiconductor active devices such as field effect transistors (FET). The capacitor 100 is electrically connected to those semiconductor devices, thus, the Second Embodiment Next, a process of forming the capacitor 100 will be described as referring to FIGS. 3A to 5D, where FIGS. 3A, 4A and 5A are plan views showing the capacitor 100 at respective steps, FIGS. 3B to 5B, 3C to 5C, and 3D to 5D are cross section of the capacitor 100 at respective steps each taken along the lines, nb-nb, nc-nc, and nd-nd, where n is III, IV, and V, respectively.

The process first forms the lower electrode 14 on the insulating film 12 as shown in FIGS. 3A to 3D. Specifically, the lower metal 14a made of tungsten silicide (WSi) and titanium (Ti) are sequentially deposited on the insulating film 12 by, for instance, sputtering; then the topmost layer made of gold (Au) is formed by plating. Thereafter, the Ti layer as the upper layer 14b is partly deposited on the lower layer 14a, or deposited on whole of the lower layer 14a then partially etched so as to expose the lower layer 14a periodically with an interval of 50 to 200 µm. Then, as shown in FIGS. 4A to 4D, the supplemental layers 20 are formed only on areas where the lower layer 14a, in particular, the Au layer in the top of the lower layer 14a exposes, by electroless plating with a thickness of 0.2 to 1.0 µm. Because the plated Au layers have relatively larger diameters of Au clusters and residual strain, which results in resistivity not disregarded as an electron device, the plated layers are set in a high temperature around 300° C. for 30 minutes.

Then, as FIGS. 5A to 5D show, the process deposits the insulating film 16 on the surface of the lower electrode 14, exactly the upper layer 14b made of titanium (Ti), the side and the top of the supplemental layers 20 by, for instance, the plasma-enhance chemical vapor deposition (p-CVD) technique at a deposition temperature of around 300° C. Finally, the process forms the upper electrode 18 on the SiN film 16 between the supplemental layers 20 by the metal evaporation. Specifically, patterning a photoresist so as to cover the supplemental layers 20 and expose the areas between the supplemental layers 20, evaporating metals on whole surface of the insulating film 16 exposed from the photoresist and on the photoresist, and removing the deposited metals on the photoresist by solving the photoresist, the upper electrode 18 may be left only between the supplemental layers 20. Thus, the process of forming the capacitor 100 is completed.

The supplemental layers 20, which are formed by electroless plating and contain Au clusters, may compensate vacancies and voids in the lower layer 14a formed by the diffusion of Au clusters during the heat treatment. Thus, the lower electrode 14 causes substantially no voids or vacancies in the area within 100 µm at most from the supplemental layers 20, which makes the surface of the lower electrode 14 flat and smooth enough and resultantly, the surface of the insulating film 16 and that of the upper electrode 18 become flat enough without any hillocks and/or depressions, which means that the lower electrode 14 and the upper electrode 18 are formed substantially in parallel and a designed breakdown voltage of the capacitor may be realized. Thinner portions in the insulating film 16 degrade the breakdown voltage between the lower and upper electrodes, 14 and 18.

A nitride semiconductor device has a feature that a breakdown voltage thereof becomes larger compared with that of devices primarily made of silicon (Si) because of an inherent difference in the bandgap energy thereof. Therefore, a capacitor integrated with nitride semiconductor devices are requested to show a breakdown voltage comparable to nitride semiconductor devices. The capacitor 100 according to the present embodiment may satisfy this request. The embodiment provides a metal, or metals, common in the lower layer 14a, exactly, the topmost layer in the lower layer 14, and the supplemental layers 20. The common metal of the embodiment is gold (Au) but other metals may be applicable. The gold (Au) atoms, or clusters, in the supplemental layers 20 may compensate vacancies or voids caused by the diffusion of the Au atoms or clusters during the heat treatment of the plated layer at a high temperature, which is 300° C. in the embodiment but temperatures higher than 300° C. are applicable to the process of the embodiment. Also, treating time longer than 30 minutes is applicable in the process.

The upper layer 14b made of titanium (Ti) may effectively suppress the lower layer 14a, in particular, the topmost layer thereof made of gold (Au) from causing hillocks due to condensation of gold (Au) atoms or clusters in the plated layer, which also makes vacancies and voids therein. The supplemental layers 20 are in direct contact to the topmost layer. Moreover, the supplemental layers 20 include metals common to those contained in the topmost layer, which are gold (Au) in the present embodiment. Accordingly, gold (Au) atoms and clusters in the supplemental layers 20 may effectively compensate the vacancies and voids caused in the lower layer 14a. The topmost layer may be made of other metals except for gold (Au). Also, the upper layer 14b may be made of other metals except for titanium (Ti), for instance, those having melting temperatures higher than that of the topmost layer. When a topmost layer causes substantially no hillocks, the capacitor 100 may remove the upper layer 14b. Even in such an arrangement without the upper layer 14b, the supplemental layers 20 may effectively compensate the vacancies or voids caused in the topmost layer during the heat treatment.

As figures indicate; the supplemental layers 20 are arranged with substantial intervals therebetween. The intervals are preferably smaller than 200 µm but preferably wider than 30 µm. Wider intervals possibly leave regions where the compensation of gold atoms or clusters from the supplemental layers 20 are not preformed; while, narrower intervals result in lesser capacitance of the capacitor 100 because the upper electrodes 18 are formed between the supplemental layers 20.

The supplemental layers 20 may partly cover the lower electrode 14. When the intervals between the supplemental layers 20 expands, the vacancies and voids are possibly formed in the lower layer 14a because the compensation by gold (Au) atoms or clusters from the supplemental layers 20 may be ineffective. On the other hand, greater ratios of the coverage of the supplemental layers 20 result in the reduction of the capacitance. The supplemental layers 20 may be formed typically by electroless plating because the plated metal generally has clusters with various sizes thereof, which may enhance the diffusion of the clusters with relatively smaller sizes passing between the clusters with relatively larger sizes. Thus, the compensation of the vacancies or voids in the lower layer 14a by the clusters in the supplemental layers 20 may be enhanced.

The upper electrode 18 may be formed in areas adjacent to the supplemental layers 20 within a distance of about 100 μm because the areas are substantially free from the vacancies or voids. Accordingly, the top electrode 18 may be formed on a flat surface of the insulating film 16. In other words, the upper electrode 18 may be formed on the areas not overlapping with the supplemental layers 20, or, formed in side by side with respect to the supplemental layers 20. Also, the upper electrode 18 may be formed on a substantially flat surface of the insulating film 16, which may uniformly form the upper electrode 18 without any thinned portions.

Figure 6A:
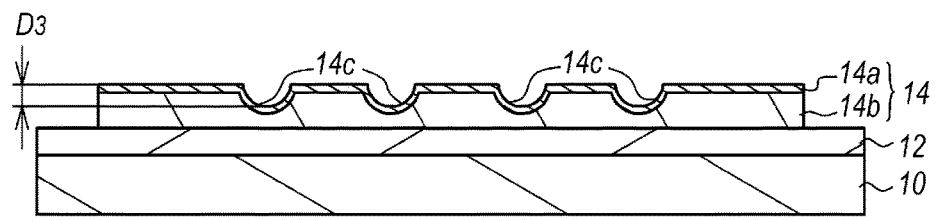
FIG. 6A to 6C show cross sections of a capacitor at respective processes comparable to the process of the present invention.

Next, a capacitor comparable to the present invention will be described as referring to FIGS. 6A to 6C that show cross sections at respective process steps. As described, the heat treatment after the formation of the lower electrode 14 possibly causes voids and vacancies 14c in the lower layer 14a, especially, when the topmost layer in the lower layer 14a is formed by electroless plating, the heat treatment at a temperature higher than 300° C. causes many voids 14c and vacancies in the lower layer 14a. The voids, or the vacancies, 14c are dents or hollows with depths of 0.05 to 0.2 μm and widths of 0.5 to 2 μm.

Figure 6B:
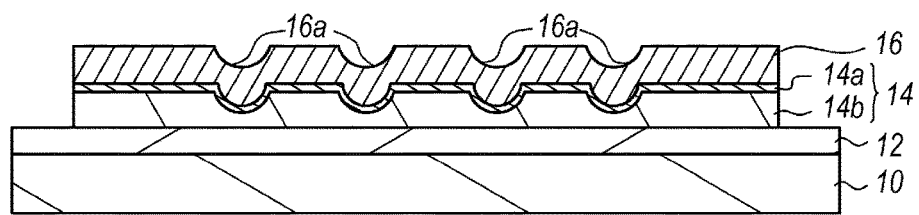
Figure 6C:
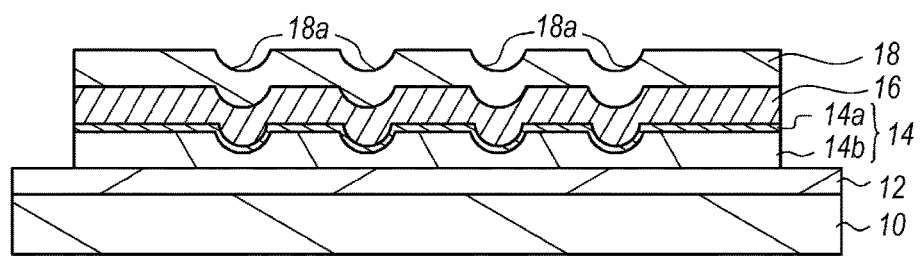

The insulating film 16 is deposited onto the lower electrode 14 as shown in FIG. 6B. The insulating film 16 also causes the hollows 16a reflecting the voids in the lower layer 14a in the lower electrode 14. Moreover, covering the insulating film 16 with the upper electrode 18, the upper electrode 18 also accompanies with hollows 18a reflecting the hollows 16a in the insulating film. 16 and the voids 14c in the lower electrode 14. An important point is that the insulating film 16 becomes thinner at edges of the hollows 16a thereof, which degrades the breakdown voltage of the capacitor, or short circuit, between the lower electrode 14 and the upper electrode 18.

Third Embodiment

Figure 7A:
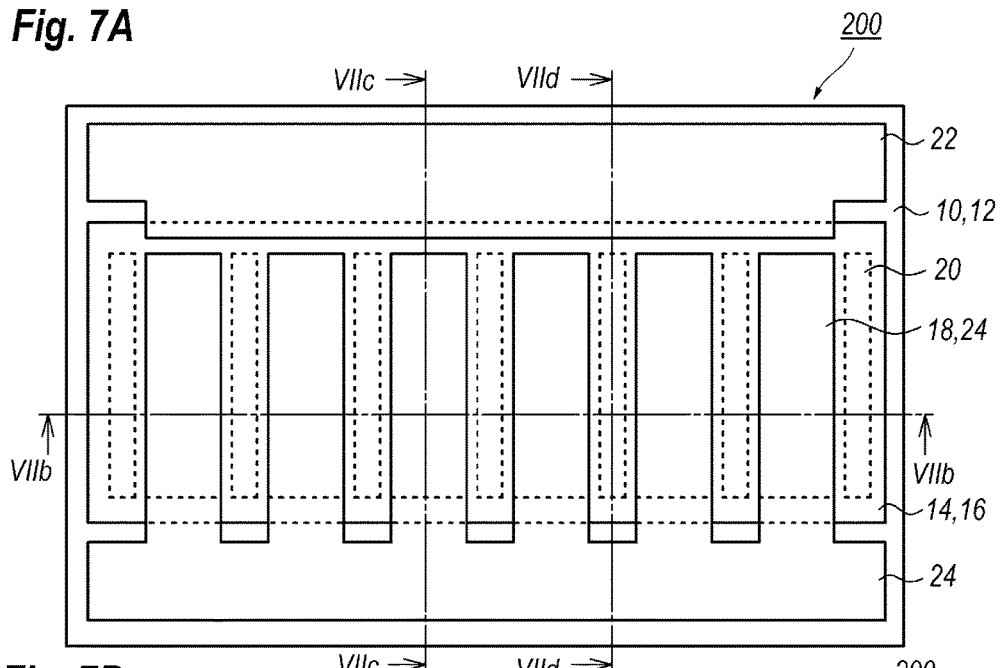
FIG. 7A is a plan view showing another capacitor according to the second embodiment of the present invention.
Figure 7B:
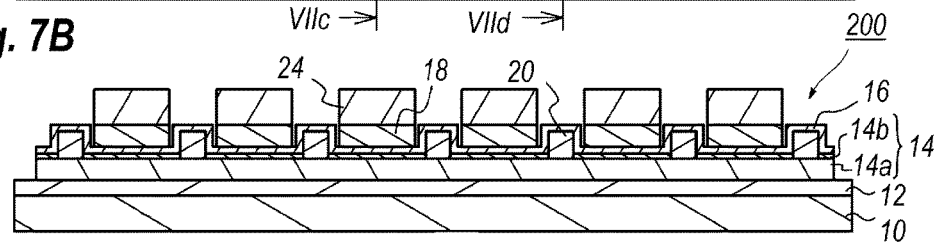
FIGS. 7B to 7D show cross sections of the capacitor of the second embodiment, where they are taken along the lines VIIb-VIIb, VIIc-VIIc, and VIId-VIId, respectively, indicated in FIG. 7A.
Figure 7C:
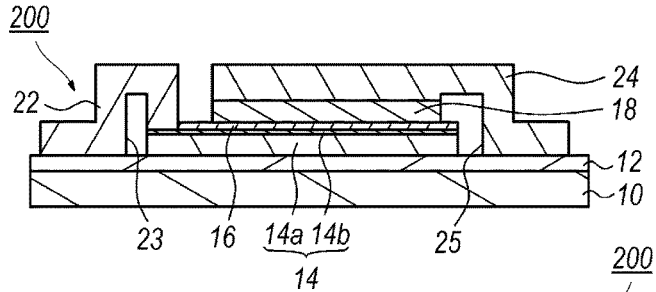
Figure 7D:
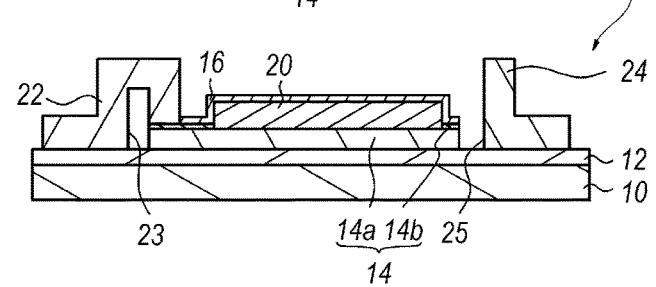

The third embodiment of the capacitor provides interconnections each connected to the lower electrode 14 and the upper electrode 18. FIG. 7A is a plan view of the capacitor 200 of the second embodiment, while, FIG. 7B to 7D shows cross sections taken along the VIIb-VIIb, VIIc-VIIc, and VIId-VIId, respectively.

The capacitor 200 provides a lower interconnection 22 on the insulating film 12 and an upper interconnection 24. The former interconnection 22 is connected to a part of the lower electrode 14 through air-bridges 23 but isolated from the upper electrode 18, while, the latter interconnection 24 is connected to a part of the upper electrode 18 through air bridges 25 but isolated from the lower electrode 14. The lower and upper interconnections, 22 and 24, may be made of stacked metal including a Ti—W layer formed by sputtering and having a thickness of about 100 nm, an Au layer also formed by sputtering and having a thickness of around 100 nm, and an Au layer formed by plating and having a thickness of 3 μm.

Fourth Embodiment

Figure 8A:
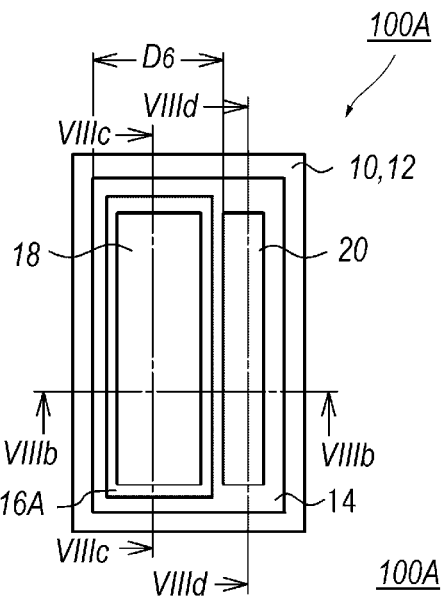
FIG. 8A is a plan view of a capacitor according to the third embodiment of the present invention.
Figure 8B:
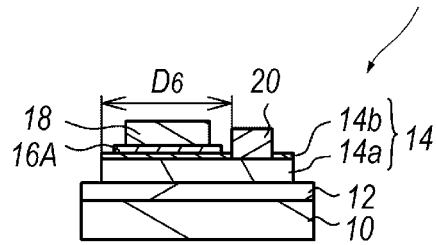
FIGS. 8B to 8D, show cross sections of the capacitor of the third embodiment where they are taken along the ling VIIIb-VIIIb, VIIIc-VIIIc, and VIIId-VIIId, respectively, indicated in FIG. 8A.
Figure 8C:
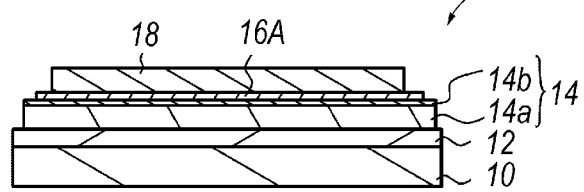
Figure 8D:
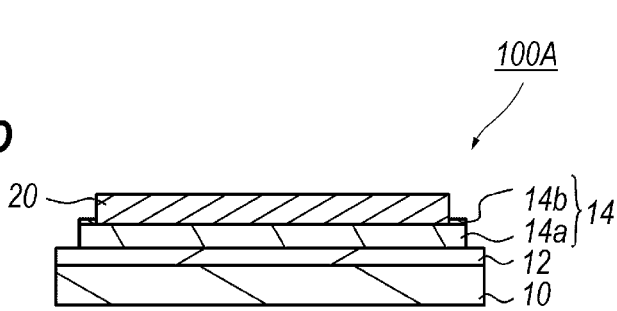

FIG. 8A is a plan view of a capacitor 700 according to the fourth embodiment of the present application, and FIGS. 8B to 8D show cross sections of the capacitor 700 taken along the lines, VIIIb-VIIIb, VIIIc-VIIIc, and VIId-VIId The capacitor 100A has a feature that the insulating film 16A of the present embodiment does not cover the supplemental layer 20. That is, the insulating film 16A covers a portion of the lower electrode 14 so as to expose peripheries of the upper layer 14b made of Ti and the supplemental layer 20; and the upper electrode 18 is formed on the insulating film 16A so as to expose peripheries of the insulating film 16A. That is, the upper electrode 18 and the supplemental layer 20 are arranged in side by side. The lower electrode 14 in an edge thereof positioned in a far side with respect to the supplemental layer 20 is apart therefrom within a distance $D_6$ of 100 μm. Thus, the insulating film, 16 or 16A, is necessary to be arranged at least so as to cover the upper layer 14b of the lower electrode 14.

FIGS. 9A to 9D are plan views showing capacitors, 100B to 100E, modified from the capacitors showing in FIGS. 2A and 8A, where FIGS. 9A to 9D show geometrical relations between the supplemental layers and the upper electrodes. The capacitor 100B shown in FIG. 9A arranges one supplemental layer 20 and two upper electrodes 18 in respective sides of the supplemental layer 20. The capacitor 100C shown in FIG. 9B has a cross-shaped supplemental layer 20B and four upper electrodes 18C in respective corners demarcated by the cross-shaped supplemental layer 20B. The capacitor 100D shown in FIG. 9C provides the upper electrode 18D in a center thereof and two supplemental layers 20 in respective sides of the upper electrode 18D. The capacitor 100E shown in FIG. 9D provides the supplemental layer 20E with a U-character shape and the upper electrode 18 arrange within the U-character. That is, the upper electrode 18E is surrounded in the supplemental layer 20E in three sides thereof. Those arrangements of the supplemental layers, 20 to 20E, may effectively suppress or prevent the top lower layer 14a of Au layer from causing the voids and vacancies during the heat treatment thereof.

In the examples of the capacitors, 100 to 100E, thus described, the insulating film 12 on the substrate 10 is not always necessary therefor. That is, the lower electrode 14 may be in direct contact to the substrate 10. The insulating film 16 may be, substituting from silicon nitride (SiN), made of silicon oxide ($SiO_2$), oxy-nitride (SiON), aluminum oxide ($Al_2O_3$), and so on.

The substrate 10 may be made of compound semiconductor material such as those of nitride semiconductor material and arsenide semiconductor material, where the former may include gallium nitride (GaN), aluminum gallium nitride (AlGaN), indium gallium nitride (InGaN), indium nitride (InN), and indium aluminum gallium nitride (InAlGaN), while the latter may include gallium arsenide (GaAs), aluminum gallium arsenide (AlGaAs), and so on. Also, the substrate may provide, in addition to the capacitor of the present invention, active and passive circuit elements.

While particular embodiments of the present invention have been described herein for purposes of illustration, many modifications and changes will become apparent to those skilled in the art. Accordingly, the appended claims are intended to encompass all such modifications and changes as fall within the true spirit and scope of this invention.

I claim:

1. A process of forming a metal-insulator-metal (MIM) capacitor, comprising steps of:
    forming a lower electrode including a lower layer and an upper layer that is made of refractory metal;
    forming an opening in the upper layer of the lower electrode;
    forming a supplemental layer on the lower layer exposed within the opening of the upper layer;

heat treating the lower electrode and the supplemental layer at a temperature higher than 300° C.;
covering at least the upper layer of the lower electrode with an insulating film; and
forming an upper electrode in an area on the insulating film, the area being not overlapped with the supplemental layer and within 100 μm at most from the supplemental layer,
wherein the supplemental layer is made of a same metal as a metal contained in the lower layer of the lower electrode.

2. The process of claim 1,
wherein the step of forming the lower electrode includes a step of forming the lower layer to have multiple supplemental layers, at least a topmost layer of the multiple supplemental layers being formed by plating; and
wherein the step of forming the supplemental layer includes a step of plating a metal common to a metal of the topmost layer in the lower layer of the lower electrode.

3. The process of claim 2,
wherein the step of forming the opening in the upper layer of the lower electrode includes a step of exposing the topmost layer in the lower layer.

4. The process of claim 2,
wherein the step of plating the topmost layer of the multiple supplemental layers includes a step of forming the topmost layer of gold (Au) by electroless plating; and
wherein the step of forming the supplemental layer includes a step of forming the supplemental layer of gold (Au) by electroless plating.

5. The process of claim 4,
wherein the step of forming the lower layer in the lower electrode includes steps of:
depositing a seed layer made of silicide metal;
depositing an intermediate layer made of titanium (Ti); and
forming the topmost layer by the electroless plating.

6. The process of claim 1,
wherein the step of covering at least the upper layer includes a step of covering the upper layer and the supplemental layer by the insulating film.

7. The process of claim 1,
wherein the step of forming the lower electrode includes a step of depositing a refractory metal as the upper layer on the lower layer.

* * * * *